United States Patent
Roy et al.

(10) Patent No.: US 8,847,344 B2
(45) Date of Patent: Sep. 30, 2014

(54) PROCESS FOR FABRICATING A BACKSIDE-ILLUMINATED IMAGING DEVICE AND CORRESPONDING DEVICE

(75) Inventors: Francois Roy, Seyssins (FR); Francois Leverd, Saint Ismier (FR); Jens Prima, Siegen (DE)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 13/483,274

(22) Filed: May 30, 2012

(65) Prior Publication Data

US 2012/0306035 A1 Dec. 6, 2012

(30) Foreign Application Priority Data

Jun. 6, 2011 (FR) ...................................... 11 54895

(51) Int. Cl.
*H01L 31/0232* (2014.01)
*H01L 27/146* (2006.01)

(52) U.S. Cl.
CPC .... *H01L 27/14632* (2013.01); *H01L 27/14689* (2013.01); *H01L 27/1464* (2013.01); *H01L 27/14643* (2013.01)
USPC ............. 257/432; 257/E27.134; 257/E31.127

(58) Field of Classification Search
CPC ...................... H01L 27/1464; H01L 27/14632
USPC ............................. 257/432, E27.134, E31.127
See application file for complete search history.

(56) References Cited

U.S. PATENT DOCUMENTS

| 6,174,820 | B1 * | 1/2001 | Habermehl et al. | 438/745 |
|---|---|---|---|---|
| 2009/0174037 | A1 * | 7/2009 | Choi | 257/618 |
| 2010/0006908 | A1 | 1/2010 | Brady | |
| 2010/0006969 | A1 | 1/2010 | Park et al. | |
| 2010/0099266 | A1 * | 4/2010 | Oswald et al. | 438/719 |

FOREIGN PATENT DOCUMENTS

| KR | 20100047574 A | 5/2010 |
|---|---|---|
| WO | WO-2009107755 A1 | 9/2009 |

OTHER PUBLICATIONS

INPI Search Report and Written Opinion for FR1154895 mailed Sep. 2, 2011 (7 pages).

* cited by examiner

*Primary Examiner* — Kimberly Rizkallah
*Assistant Examiner* — Alexander Belousov
(74) *Attorney, Agent, or Firm* — Gardere Wynne Sewell LLP

(57) ABSTRACT

An integrated imaging device includes a silicon layer provided over a dielectric multilayer. The dielectric multilayer includes a top silicon-dioxide layer, an intermediate silicon-nitride layer and a bottom silicon-dioxide layer. Imaging circuitry is formed at a frontside of the silicon layer. An isolating structure surrounds the imaging circuitry and extends from the frontside through the silicon layer and top silicon-dioxide layer into and terminating within the intermediate silicon-nitride layer. A filter for the imaging circuitry is mounted to a backside of the bottom silicon-dioxide layer. The isolating structure is formed by a trench filled with a dielectric material.

15 Claims, 5 Drawing Sheets

PROCESS FOR FABRICATING A BACKSIDE-ILLUMINATED IMAGING DEVICE AND CORRESPONDING DEVICE

PRIORITY CLAIM

This application claim priority from French Application for Patent No. 1154895 filed Jun. 6, 2011, the disclosure of which is hereby incorporated by reference.

TECHNICAL FIELD

The invention relates to integrated backside-illuminated imaging devices.

BACKGROUND

Integrated backside-illuminated imaging devices generally comprise light-detecting cells, or photosites, placed on the frontside of the substrate in which they are fabricated, and optical filters, for example color filters, on the backside of the substrate. Thus, light reaches the photosites directly after having passed through the color filters, in contrast to integrated frontside-illuminated devices in which the light passes through the back end of line (BEOL) interconnect layers before reaching the photosites.

These devices are generally produced in silicon-on-insulator (SOI) wafers. The photosites are then located in a silicon layer deposited on a silicon-dioxide ($SiO_2$) layer forming a buried oxide (BOX). Color filters are placed neighboring the silicon-dioxide layer, the SOI wafer having been thinned so as to remove the silicon located under the buried oxide.

A silicon-nitride ($Si_3N_4$) layer may be deposited on the buried oxide after the SOI wafer has been thinned and before the color filters have been formed. This silicon-nitride layer forms, with the buried silicon-dioxide layer, an antireflection layer enabling light absorption to be maximized in the light-sensitive regions of the photosites. This being so, the antireflection layer formed by the buried oxide and the silicon-nitride layer is not effective enough for backside-illuminated imaging applications. This is because the thickness of the buried oxides, for example about 150 nanometers, does not allow sufficiently effective antireflection layers to be obtained.

Moreover, in order to isolate the photosites from one another deep isolating trenches are produced. These deep isolating trenches comprise a dielectric and extend from the frontside of the substrate in which the components are produced into the buried oxide layer. These trenches also allow optical waveguides to be formed, which waveguides enable light to be guided from the backside to light-sensitive regions of the imaging devices, thereby limiting crosstalk.

During fabrication of these isolating trenches, a step of etching is carried out from the frontside. This etching is stopped in the buried silicon-dioxide layer. This is because, in this etching step for forming a plurality of cavities, the cavities do not all have the same depth and a thick silicon-dioxide layer compensates for this etching non-uniformity. This being so, the use of a thick silicon-dioxide layer, for example about 150 nanometers in thickness, does not allow, as indicated above, an effective antireflection layer to be obtained.

SUMMARY

According to one method of implementation and embodiment, the effectiveness of the antireflection layer is improved while allowing integration of deep isolating trenches.

According to one aspect, an improvement in the effectiveness of the antireflection layer is obtained in a device comprising deep isolating trenches.

According to one aspect, a process is provided for fabricating an integrated backside-illuminated imaging device, comprising: forming at least one cavity in a substrate comprising a dielectric multilayer comprising a top silicon-dioxide ($SiO_2$) layer, an intermediate silicon-nitride ($Si_3N_4$) layer, and a bottom silicon-dioxide ($SiO_2$) layer, and a silicon layer on the dielectric multilayer and having a frontside, said cavity extending from said frontside into the intermediate silicon-nitride layer; and filling said at least one cavity with a dielectric so as to form an isolating trench.

Using a substrate comprising, before the isolating trench is formed, a dielectric multilayer consisting of a top silicon-dioxide ($SiO_2$) layer, an intermediate silicon-nitride ($Si_3N_4$) layer, and a bottom silicon-dioxide ($SiO_2$) layer, allows a thin top silicon-dioxide layer, for example 5 to 7 nanometers in thickness, to be used so as to obtain a good antireflection layer with the intermediate silicon-nitride layer while stopping the etching in a thick silicon-nitride layer, for example 50 to 70 nanometers in thickness. Thus, an effective antireflection layer and isolation trenches opening into the dielectric multilayer are obtained.

The bottom silicon-dioxide layer especially allows a good interface to be obtained with an underlying silicon layer, for example the remaining silicon substrate of an SOI wafer comprising a dielectric multilayer.

The dielectric multilayer formed by the three layers is well known per se to those skilled in the art under the acronym "ONO" (oxide/nitride/oxide) and may be incorporated in a wafer in which isolating trenches will be formed.

The process may also comprise, in the conventional way, forming light-sensitive regions for the imaging device and forming components in the silicon layer neighboring the frontside. Of course, light will first pass through the dielectric multilayer before reaching these light-sensitive regions. The dielectric multilayer is therefore located substantially neighboring the backside of the imaging device.

Advantageously, said at least one cavity is filled with silicon dioxide. The use of silicon dioxide allows a good electrical isolation to be obtained, and the refractive index difference between the silicon and the silicon dioxide makes it possible to form an optical waveguide.

The process may comprise: forming a plurality of cavities in the substrate, the cavities extending from said frontside into the intermediate silicon-nitride layer; and filling said cavities with a dielectric so as to form a plurality of isolating trenches, the plurality of isolating trenches forming a plurality of regions isolated from one another in the silicon layer.

During the formation of the plurality of cavities by etching, the intermediate silicon-nitride layer is thick enough (for example about 50 to 70 nanometers in thickness) to compensate for any potential etching non-uniformity.

The substrate may comprise a bottom silicon layer, the dielectric multilayer being placed between said silicon layer having the frontside and said bottom silicon layer, and the process may comprise removing the bottom silicon layer, and an array of color filters neighboring the bottom silicon-dioxide layer, said filters forming the backside of the imaging device.

The bottom silicon layer may be removed in a thinning step, for example by chemical-mechanical polishing and by chemical etching. Since the isolating trenches stop in the intermediate silicon nitride layer, the removal does not reach the bottom of the trenches.

According to another aspect, an integrated backside-illuminated imaging device is provided, comprising a dielectric multilayer comprising a top silicon-dioxide layer, an intermediate silicon-nitride layer, and a bottom silicon-dioxide layer, and a silicon layer on the dielectric multilayer and having a frontside, said device comprising at least one isolating trench extending from the frontside into the intermediate silicon-nitride layer.

Thus, the device does not comprise isolating trenches extending as far as a silicon-dioxide layer, but only into a silicon-nitride layer.

Said top silicon-dioxide layer may be between 5 and 7 nanometers in thickness.

Said intermediate silicon-nitride layer may be between 50 and 70 nanometers in thickness.

Said at least one isolating trench may comprise silicon dioxide.

The device may comprise a plurality of isolating trenches extending from the frontside into the intermediate silicon-nitride layer, the plurality of isolating trenches forming a plurality of regions isolated from one another in the silicon layer.

The device may furthermore comprise, neighboring the bottom silicon-dioxide layer, color filters, said filters forming the backside of the imaging device.

BRIEF DESCRIPTION OF THE DRAWINGS

Other advantages and features of the invention will become clear on studying the detailed description of methods of implementation and embodiment, given by way of non-limiting example, and illustrated by the annexed drawings in which.

DETAILED DESCRIPTION OF THE DRAWINGS

Figure 1:
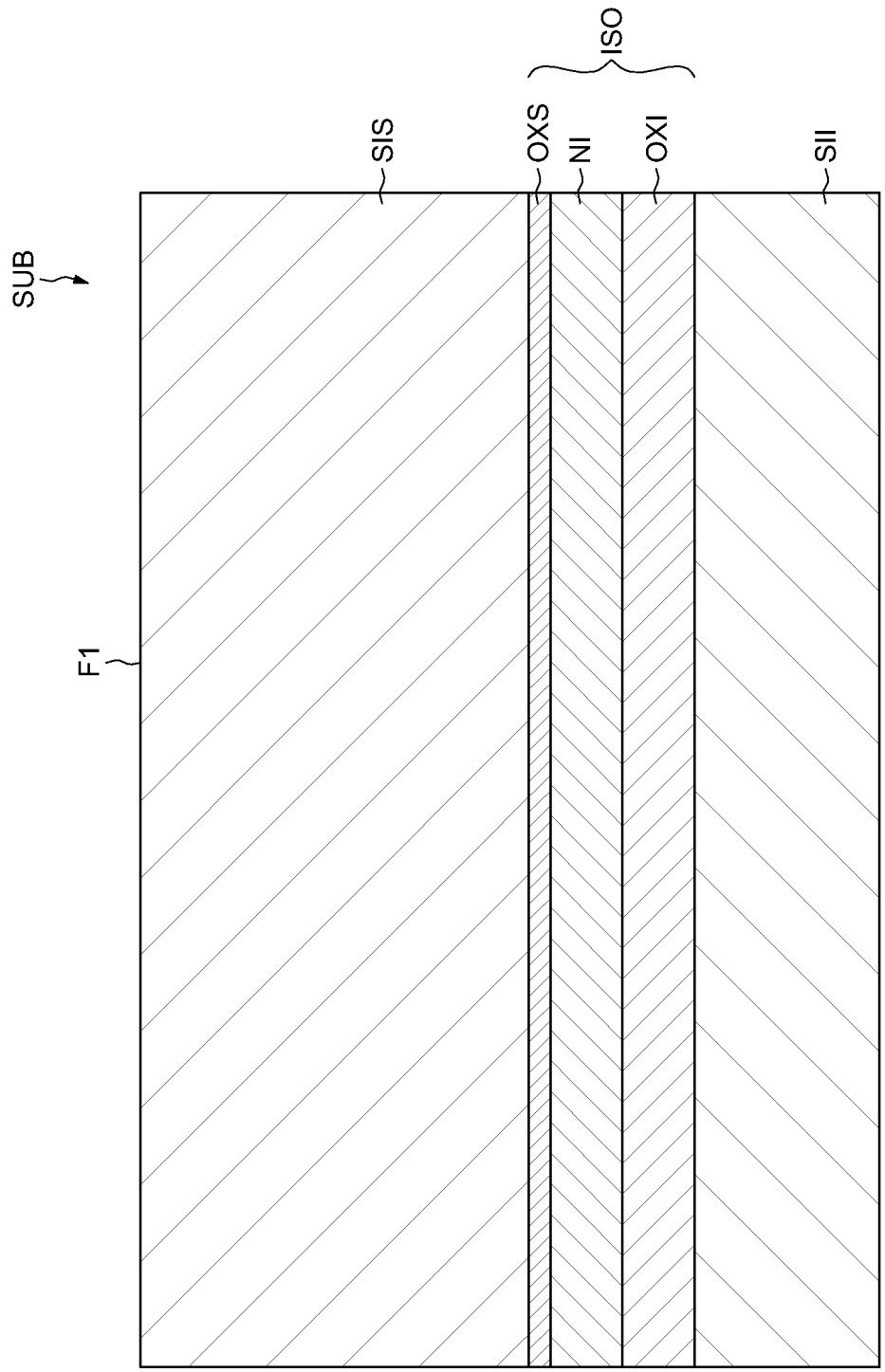
FIGS. 1 to 5 illustrate schematically various steps of one method of implementation of a process and one embodiment of an integrated backside-illuminated imaging device.

In FIG. 1, a semiconductor wafer SUB is shown. The semiconductor wafer SUB is an SOI substrate comprising a top silicon layer SIS, a buried insulating region ISO and a bottom silicon layer SII.

The top silicon layer SIS comprises a frontside F1 intended for example to receive on and/or neighboring this frontside F1 the photosites (photodiodes and transistors). The frontside F1 is also the frontside of the wafer SUB. The top silicon layer SIS may be obtained by an epitaxial growth step on a thinner silicon layer. The final thickness of the top silicon layer SIS may for example be about three microns.

The bottom silicon layer SII is thick, of the order of, for example, several hundred microns.

The insulating region ISO of the wafer SUB comprises a dielectric multilayer comprising a top silicon-dioxide layer OXS (for example about 5 to 7 nanometers in thickness), an intermediate silicon-nitride layer NI (for example about 50 to 70 nanometers in thickness) and a bottom silicon-dioxide layer OXI (for example about 100 nanometers in thickness). The dielectric multilayer here forms an "ONO" multilayer.

Such a wafer SUB can be easily produced by techniques conventionally used in microelectronics. The wafer may also be obtained, for example, from SOITEC of Grenoble, France.

Figure 2:
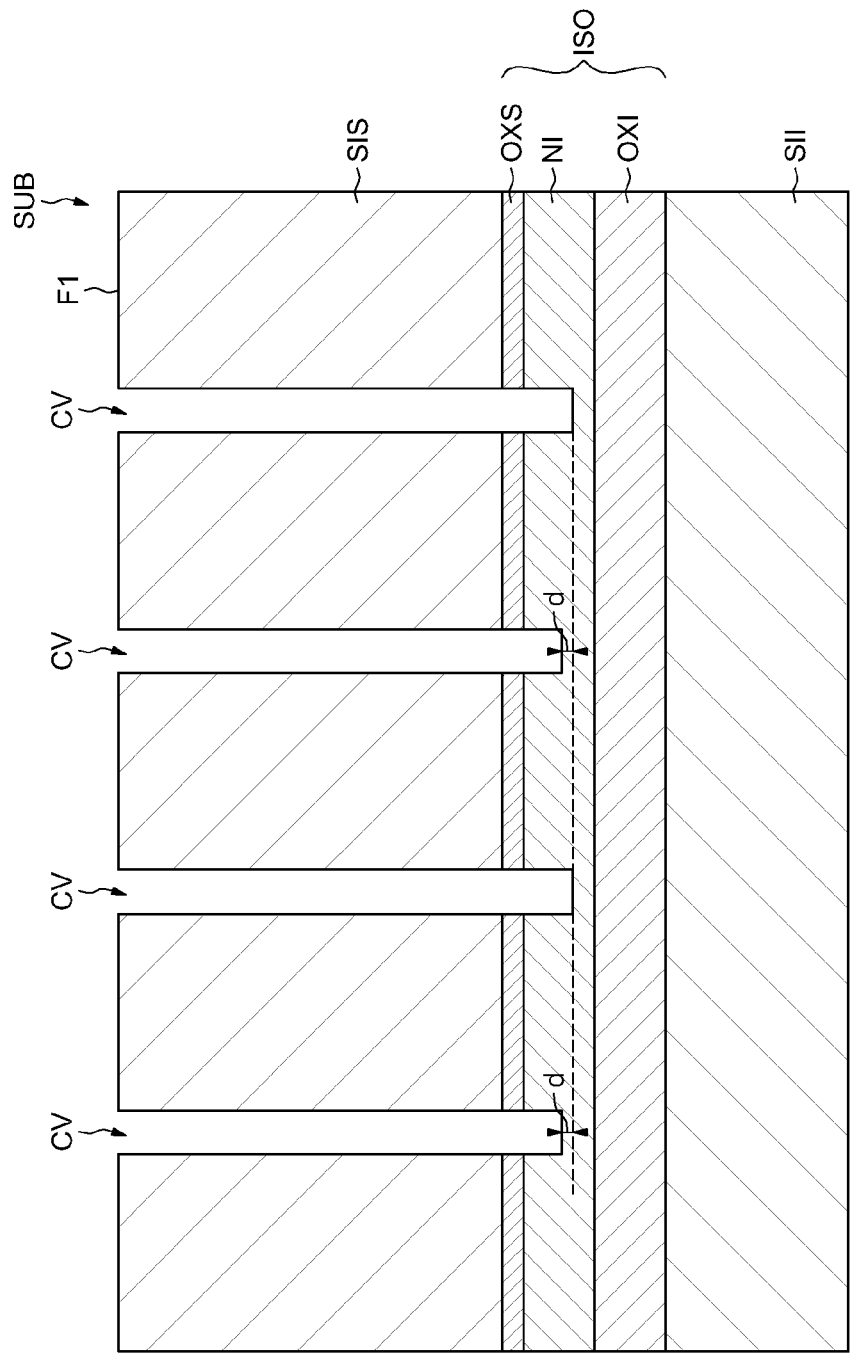

In FIG. 2 the wafer SUB is shown after an etching step has been carried out to form cavities CV. The cavities CV extend from the frontside F1 of the top silicon layer SIS into the intermediate silicon-nitride layer NI. The cavities CV pass right through the top silicon layer SIS, the top silicon-dioxide layer OXS and stop in the intermediate silicon-nitride layer NI.

In order to obtain narrow (of about one hundred nanometers in width) and deep (about three microns in depth) cavities, it is possible to use, for example, a known and conventional pulsed plasma etching. This type of etching especially makes it possible to dissipate charge that accumulates in insulating regions, for example when the insulating region ISO is reached. Pulsed plasma etching comprises a number of etching steps, and the number of etching steps defines the etch depth. It is also possible to stop the etching by means of chemical detection, for example detecting the etching of silicon nitride ($Si_3N_4$).

The cavities CV may have different depths. In FIG. 2, the cavities CV have depths that differ by a distance d. The distance d may be about ten nanometers. Thus, the top silicon-dioxide layer OXS (about 5 to 7 nanometers in thickness) is too thin to be the layer in which the cavities CV stop. The intermediate silicon-nitride layer NI (of about 50 to 70 nanometers in thickness) is sufficiently thick that the cavities CV stop in this layer despite the depth non-uniformity d.

Figure 3:
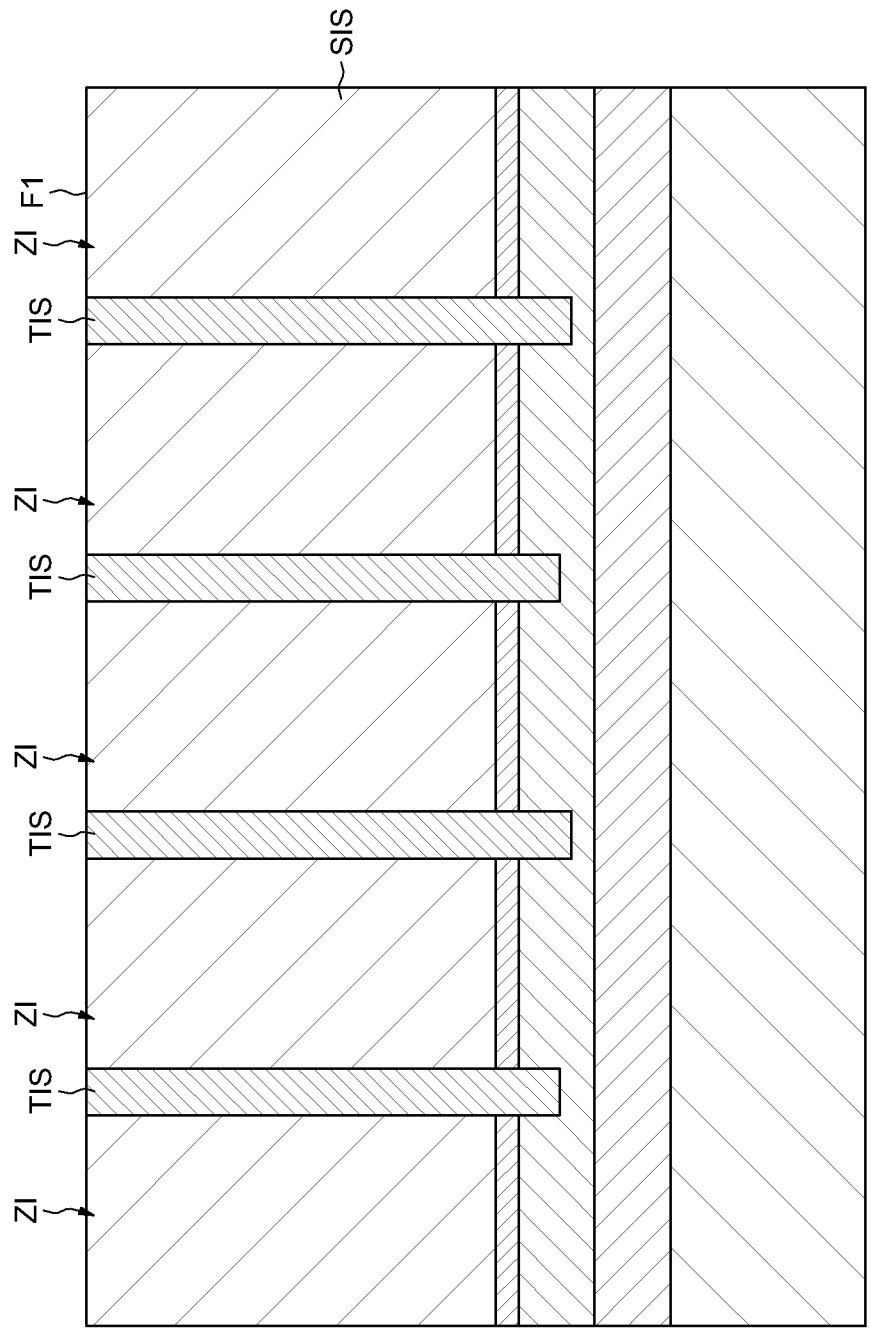

The cavities CV may then be filled (FIG. 3). The cavities CV are, for example, filled with silicon dioxide so as to form isolating trenches TIS. It is also possible to fill the cavities CV with another dielectric having a refractive index that allows waveguides to be formed.

The isolating trenches TIS are filled in a known conventional chemical vapor deposition step, for example at below atmospheric pressure.

A planarization step, for example a chemical-mechanical polishing step, may be carried out on the frontside of the substrate so as to remove any silicon-dioxide residue deposited on the top silicon layer SIS. Thus, a frontside F1 comprising silicon, or silicon dioxide, in the isolating trench TIS location is obtained.

The isolating trenches TIS bound electrically isolated regions ZI in the top silicon layer SIS. Moreover, light entering these regions ZI through the dielectric multilayer ISO is confined to these regions ZI by virtue of the refractive index difference between the silicon and the silicon dioxide present in the trenches.

Figure 4:
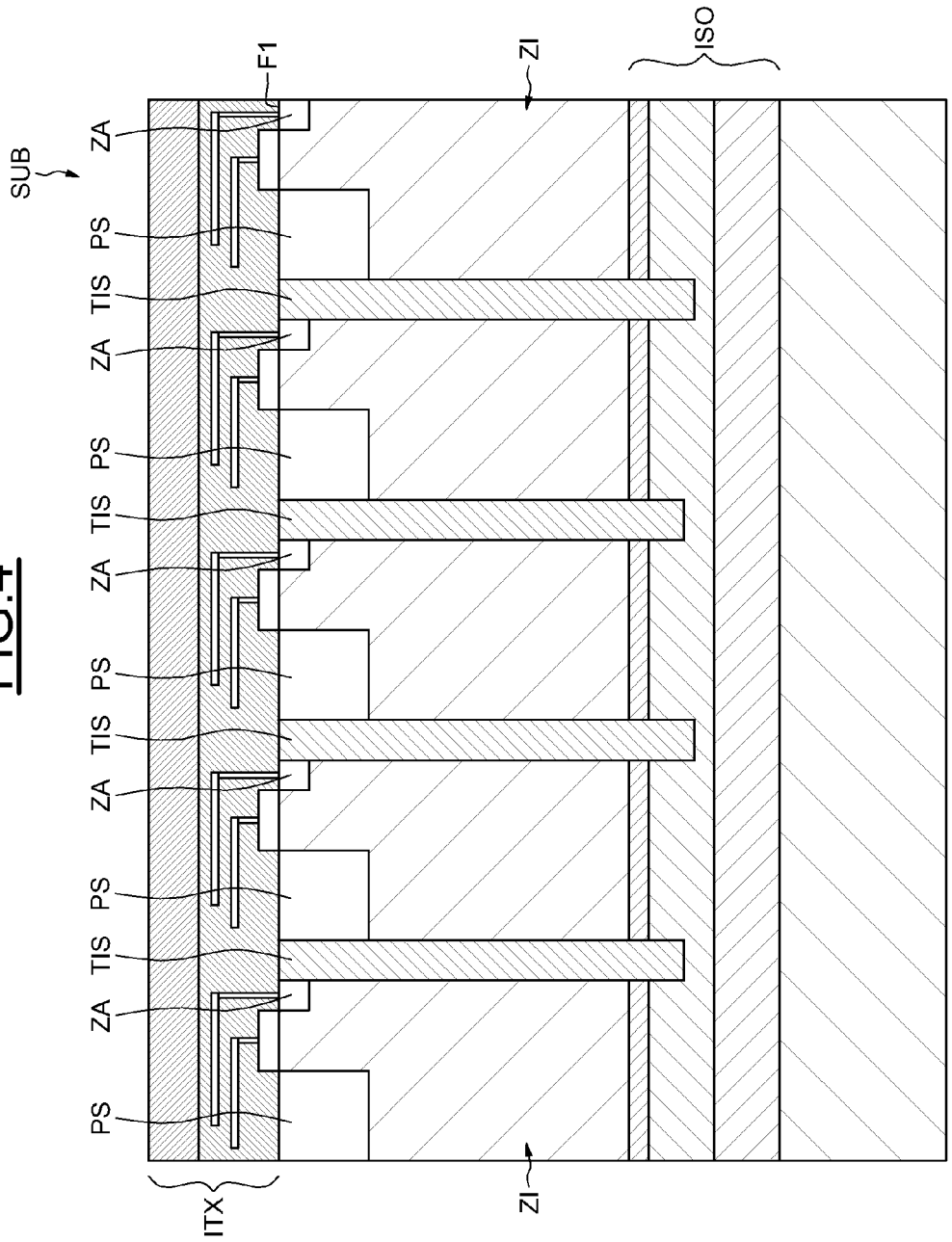

Photosites (FIG. 4) comprising, as is conventional, charge collecting zones PS and active transistor zones ZA (for example source or drain zones) may be formed in the regions ZI. The isolated regions ZI are sensitive to light and photons absorbed within these regions ZI create electron/hole pairs, the electrons being collected in the charge collecting zone PS and the holes possibly being evacuated via a contact formed on the frontside F1 (not shown here). An interconnect network ITX may be formed in the conventional way on the frontside F1 of the substrate SUB.

In order to make illumination of the light-sensitive regions corresponding to the isolated regions ZI from the backside of the imaging device easier, it is possible to remove the bottom silicon layer SII (FIG. 5) in order to obtain a substrate comprising the top silicon layer SIS and the multilayer ISO.

The bottom layer may be removed by chemical-mechanical polishing and by selective chemical etching steps in which only the silicon is etched. In these thinning steps, a rigid carrier wafer PR, for example a silicon wafer of about several hundred microns in thickness, may be joined to the interconnect network ITX.

Figure 5:
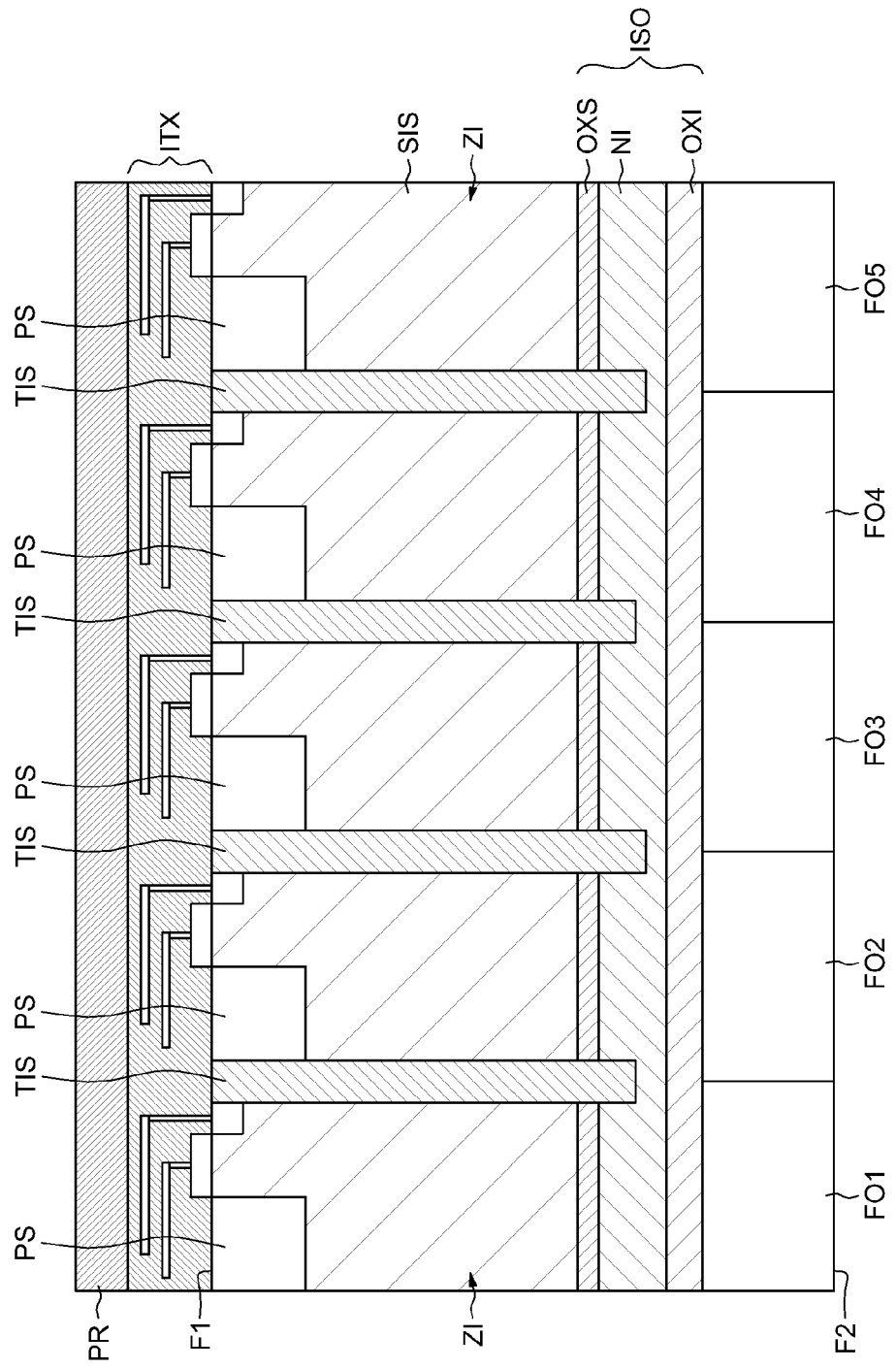

The bottom silicon-dioxide layer OXI is then exposed. The bottom silicon-dioxide layer OXI may be covered with an array of optical filters FO1, FO2, FO3, FO4 and FO5, for example color filters. The optical filters may be placed, in the conventional way, to form a Bayer pattern. In FIG. 5, the filters FO1 may be filters allowing only red light to pass, and the filters FO2 may be filters allowing only green light to pass. These filters are respectively placed opposite isolated regions ZI.

The filters FO1-FO5 have a backside F2 that forms the backside of the integrated backside-illuminated imaging device obtained. A light ray passing through an optical filter, for example optical filter FO1, is confined to the isolated region ZI, by virtue of the isolating trenches TIS, and is absorbed in the light-sensitive region corresponding to the isolated region ZI in order for electrons to be collected in the charge collecting zone PS.

Moreover, by virtue of the ONO multilayer formed by the thin top silicon-dioxide layer OXS, the intermediate silicon-nitride layer NI and the bottom silicon-dioxide layer OXI, an effective antireflection layer is obtained.

After the carrier wafer PR has been removed, an integrated imaging device that is illuminated via the backside F2, is obtained, the device comprising a dielectric multilayer ISO comprising a top silicon-dioxide layer OXS, an intermediate silicon-nitride layer NI and a bottom silicon-dioxide layer OXI, and a silicon layer on the dielectric multilayer having a frontside F1, and a plurality of isolating trenches TIS extending from the frontside F1 into the intermediate silicon-nitride layer NI, the plurality of isolating trenches forming a plurality of regions isolated from one another in the silicon layer SIS.

The imaging device comprises neighboring the bottom silicon-dioxide layer color filters FO1-FO5, said filters forming the backside of the imaging device, i.e., the side illuminated when the device is in use.

What is claimed is:

1. A process, comprising:
    forming a plurality of cavities in a substrate comprising a dielectric multilayer including a top silicon-dioxide layer, an intermediate silicon-nitride layer and a bottom silicon-dioxide layer, and a silicon layer on the dielectric multilayer having a frontside on top of the top silicon-dioxide layer, the plurality of cavities extending from said frontside into and having bottom surfaces terminating within the intermediate silicon-nitride layer; and
    filling each of the plurality of cavities with a dielectric so as to form an isolating trench;
    wherein the plurality of cavities have a non-uniform depth differing by a certain distance and wherein the intermediate silicon-nitride layer has a thickness greater than said certain distance and the top silicon-dioxide layer has a thickness less than said certain distance.

2. The process according to claim 1, wherein filling said at least one cavity comprises filling said at least one cavity with silicon dioxide.

3. The process according to claim 1, wherein the substrate further comprises a bottom silicon layer, the dielectric multilayer being placed between said silicon layer having the frontside and said bottom silicon layer, the process further comprising
    removing the bottom silicon layer; and
    applying an array of color filters neighboring the bottom silicon-dioxide layer, said filters forming a backside of an integrated backside-illuminated imaging device.

4. A method, comprising:
    opening a plurality of isolating trenches surrounding a plurality of isolated regions of a silicon layer, the plurality of trenches extending through the silicon layer and penetrating into a dielectric multilayer which supports said silicon layer, said dielectric multilayer including a top silicon-dioxide layer, an intermediate silicon-nitride layer and a bottom silicon-dioxide layer, the plurality of isolating trenches passing through the top silicon-dioxide layer and having bottom surfaces terminating within the intermediate silicon-nitride layer;
    filling the plurality of isolating trenches with an isolation material;
    forming imaging circuitry at a frontside of the silicon layer within the isolated region; and
    applying an optical structure to a backside of the bottom silicon-dioxide layer in optical alignment with the isolated region and the imaging circuitry;
    wherein the plurality of isolating trenches have a non-uniform depth differing by a certain distance and wherein the intermediate silicon-nitride layer has a thickness greater than said certain distance and the top silicon-dioxide layer has a thickness less than said certain distance.

5. The method of claim 4, wherein the optical structure comprises a filter, and the imaging circuitry is illuminated through the filter at the backside.

6. The method of claim 4, further comprising forming interconnect circuitry on the frontside of the silicon layer.

7. The method of claim 4, wherein the isolation material is a dielectric material.

8. The method of claim 7, wherein the dielectric material has a refractive index such that the filled isolating trench defines a waveguide.

9. A method, comprising:
    opening a plurality of isolating trenches which surround a plurality of isolated regions of a silicon layer, said isolating trenches extending through the silicon layer and penetrating into a dielectric multilayer which supports said silicon layer, said dielectric multilayer including a top silicon-dioxide layer, an intermediate silicon-nitride layer and a bottom silicon-dioxide layer, the isolating trenches passing through the top silicon-dioxide layer and having bottom surfaces terminating within the intermediate silicon-nitride layer;
    filling the isolating trenches with an isolation material;
    forming an integrated photosite circuit at a frontside of the silicon layer within each of said plurality of isolated regions;
    forming an electrical interconnection above the frontside that is connected to the photosite circuits; and
    applying a color filter array to a backside of the bottom silicon-dioxide layer to filter backside illumination of the photosite circuits;
    wherein the plurality of isolating trenches have a non-uniform depth differing by a certain distance and wherein the intermediate silicon-nitride layer has a thickness greater than said certain distance and the top silicon-dioxide layer has a thickness less than said certain distance.

10. The method of claim 9, wherein the isolation material is a dielectric material.

11. The method of claim 10, wherein the dielectric material has a refractive index such that the filled isolating trench defines a waveguide.

12. The method of claim 9, wherein the color filter array is a Bayer pattern array.

13. The method of claim 9, wherein each isolating trench has a width of 100 nm.

14. The method of claim 13, wherein the depths of the isolating trenches differ from each other by an amount less than or equal to 10 nanometers.

15. A method, comprising:

opening a plurality of isolating trenches which surround a plurality of isolated regions of a silicon layer, said isolating trenches extending through the silicon layer and penetrating into a dielectric multilayer which supports said silicon layer, said dielectric multilayer including a top silicon-dioxide layer, an intermediate silicon-nitride layer and a bottom silicon-dioxide layer, the isolating trenches passing through the top silicon-dioxide layer and terminating within the intermediate silicon-nitride layer;

filling the isolating trenches with an isolation material;

forming an integrated photosite circuit at a frontside of the silicon layer within each of said plurality of isolated regions;

forming an electrical interconnection above the frontside that is connected to the photosite circuits; and applying a color filter array to a backside of the bottom silicon-dioxide layer to filter backside illumination of the photosite circuits;

wherein the plurality of isolating trenches have a non-uniform depth differing by a certain distance and wherein the intermediate silicon-nitride layer has a thickness greater than said certain distance and the top silicon-dioxide layer has a thickness less than said certain distance.

* * * * *

UNITED STATES PATENT AND TRADEMARK OFFICE
CERTIFICATE OF CORRECTION

PATENT NO. : 8,847,344 B2  Page 1 of 1
APPLICATION NO. : 13/483274
DATED : September 30, 2014
INVENTOR(S) : Francois Roy et al.

It is certified that error appears in the above-identified patent and that said Letters Patent is hereby corrected as shown below:

On the Title Page:

At paragraph item (73), please correct the Assignee's name as follows:

(73)   STMicroelectronics (Crolles 2) SAS, Crolles (FR)

Signed and Sealed this
Thirtieth Day of December, 2014

Michelle K. Lee
*Deputy Director of the United States Patent and Trademark Office*